United States Patent [19]

Cheng et al.

[11] 4,293,848

[45] Oct. 6, 1981

[54] MOS ANALOG-TO-DIGITAL CONVERTER

[75] Inventors: Edmund K. Cheng, Sunnyvale; Wiley E. Hill, Cupertino, both of Calif.

[73] Assignee: Intel Corporation, Santa Clara, Calif.

[21] Appl. No.: 80,284

[22] Filed: Oct. 1, 1979

Related U.S. Application Data

[63] Continuation of Ser. No. 828,254, Aug. 26, 1977, abandoned.

[51] Int. Cl.³ .............................................. H03K 13/02
[52] U.S. Cl. .......................... 340/347 AD; 340/347 M
[58] Field of Search ... 340/347 M, 347 AD, 347 DA; 328/165; 307/251, 255, 262

[56] References Cited

U.S. PATENT DOCUMENTS

| | | | |
|---|---|---|---|
| 3,505,668 | 4/1970 | Ottesen | 340/347 AD |
| 3,684,968 | 8/1972 | Carroll | 340/347 AD X |
| 4,028,558 | 6/1977 | Heller et al. | 328/165 X |
| 4,028,694 | 6/1977 | Cook et al. | 340/347 AD |
| 4,146,882 | 3/1979 | Hoff et al. | 340/347 M X |

OTHER PUBLICATIONS

The Engineering Staff of Analog Devices, Inc., Analog–Digital Conversion Handbook, 6/1972, pp. I-6; II-46 to II-49; II-80 through II-87.

*Primary Examiner*—Thomas J. Sloyan
*Attorney, Agent, or Firm*—Blakely, Sokoloff, Taylor & Zafman

[57] ABSTRACT

An MOS, integrated circuit, analog-to-digital converter powered by a single power supply potential and suitable for converting an analog signal equal to that power supply potential is described. The input analog signal is capacitively divided by two; resistor strings interlaced with the resistance ladder of the digital-to-analog converter provides a reduced reference potential. A chopper amplifier is employed in the comparator which includes circuits for reducing offset potentials.

2 Claims, 4 Drawing Figures

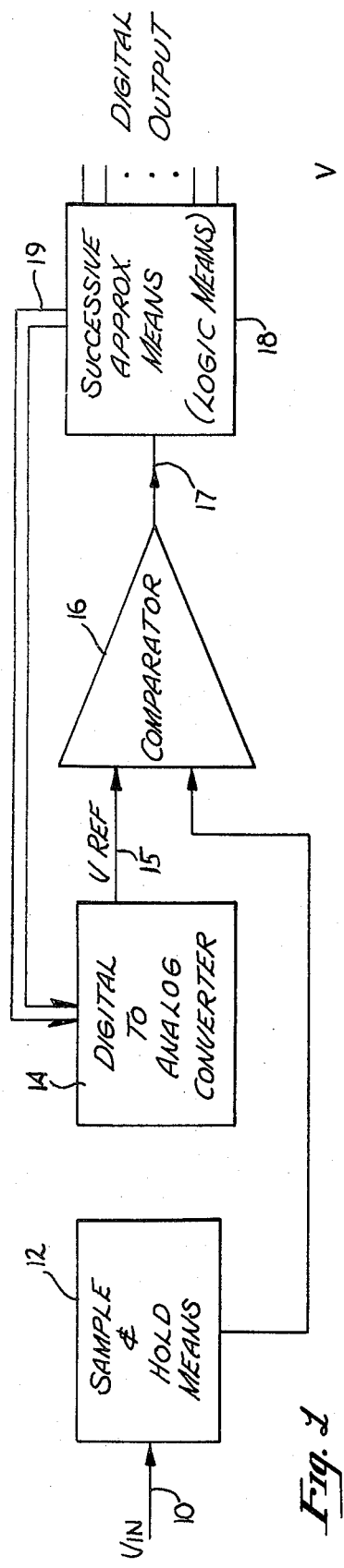
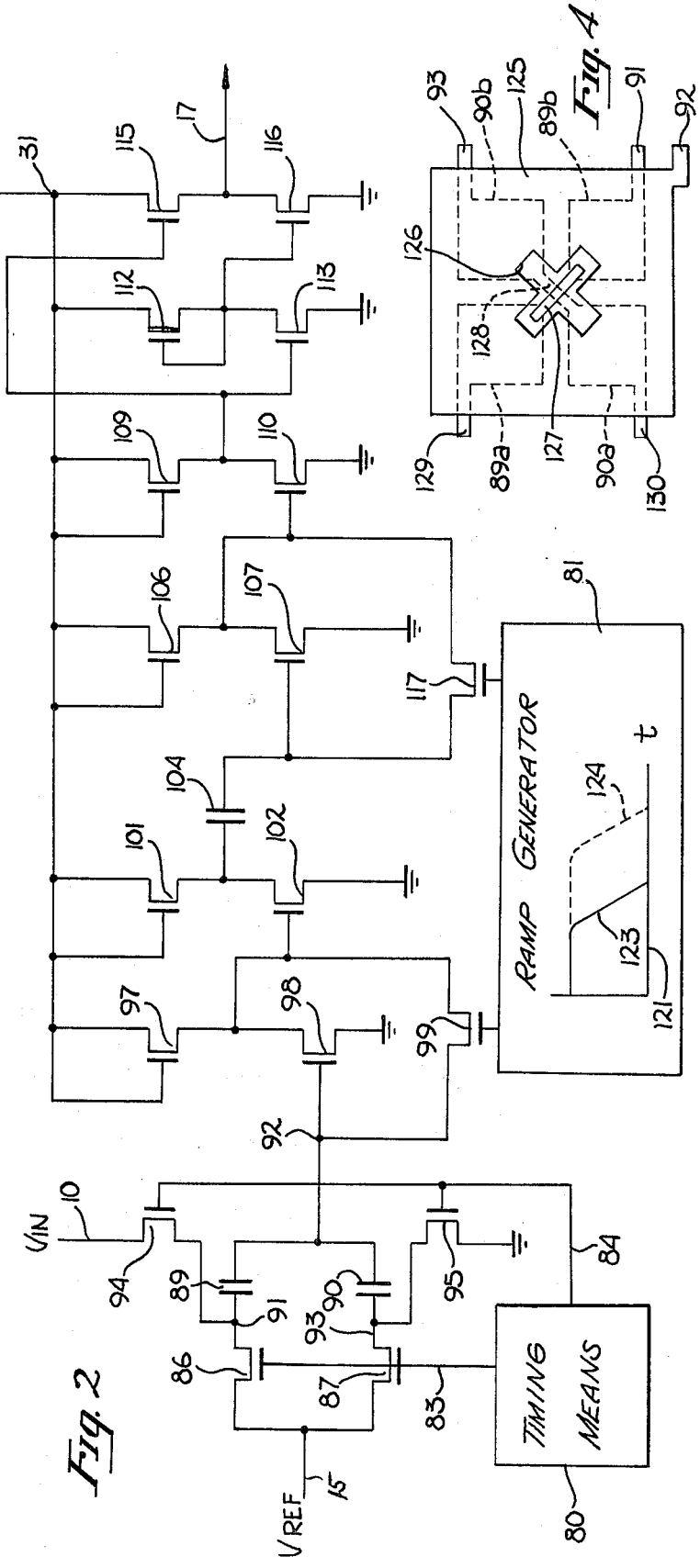

MOS ANALOG-TO-DIGITAL CONVERTER

This is a continuation of application Ser. No. 828,254, filed Aug. 26, 1977, now abandoned.

BACKGROUND OF THE INVENTION

1. Field of the Invention

The invention relates to the field of analog-to-digital converters and more particularly, to such converters fabricated with MOS technology.

2. Prior Art

The introduction of microcomputers, particularly those computers fabricated on a single substrate or chip, has made possible the use of these devices in many new applications. Since these computers are relatively inexpensive, they may be employed in home appliances, automobiles, etc.

One of the more difficult problems in employing these devices is interfacing them with sensors, transducers, and the like. Typically, sensors and transducers provide an analog voltage which must be converted to digital form for the microcomputer. Most often, this conversion is performed by bipolar, analog-to-digital converters (ADC) which are fabricated on separate chips. Ideally, these converters should be included on the same substrate with the microcomputer. The presently described ADC is suitable for fabrication on a silicon substrate which includes a microcomputer.

In less sophisticated computer applications, such as in home appliances and automobiles, it is desirable to employ only a single DC power supply. This DC power supply such as a 5 volt supply, may be employed both by sensors and transducers and also by the microcomputer and its peripheral circuits. For example, a potentiometer coupled to the 5 volt supply which may be manually adjusted, such as with a "dial" control may be employed. Thus, the ADC is required to convert, by way of example, a 5 volt analog signal into a digital signal when operating from a 5 volt supply. For MOS circuits this requires that the gates of the analog switches in the ADC be driven above the power supply potential, thereby necessitating bootstrapping circuits. Bootstrapping circuits require a considerable amount of substrate area, raising the cost of the ADC. The presently described ADC minimizes this problem by employing only a single bootstrapping circuit.

One of the major difficulties in fabricating an MOS ADC is the design of a practical voltage comparator. Ideally, the comparator should have high gain and high common mode rejection. Generally, these comparators are bipolar, direct-coupled differential amplifiers. It is difficult to realize a practical MOS differential amplifier, which operates from a single power supply potential. A unique chopper amplifier is employed in the presently invented ADC.

SUMMARY OF THE INVENTION

A metal-oxide-semiconductor (MOS), analog-to-digital converter (ADC) which operates from a single power supply potential is described. The ADC includes input means for receiving an input analog signal and for dividing this signal by a predetermined factor. A digital-to-analog converter (DAC) is coupled to the power supply potential and includes means for reducing this potential by the same predetermined factor. The ADC's comparator means compares the output from the input means with the reference voltage from the DAC. This comparator means is coupled to a logic means which controls the DAC in a somewhat ordinary manner. With the invented ADC, an analog signal having a magnitude equal to the supply potential may be readily converted with only one bootstrapping circuit.

BRIEF DESCRIPTION OF THE DRAWINGS

FIG. 1 is a block diagram of an analog-to-digital converter which is applicable both to the present invention and to prior art analog-to-digital converters.

FIG. 2 is an electrical schematic of the presently preferred embodiment of the comparator employed in the invented analog-to-digital converter.

FIG. 4 is a plan view of two capacitors used in the comparator.

DETAILED DESCRIPTION OF THE INVENTION

Figure 3:
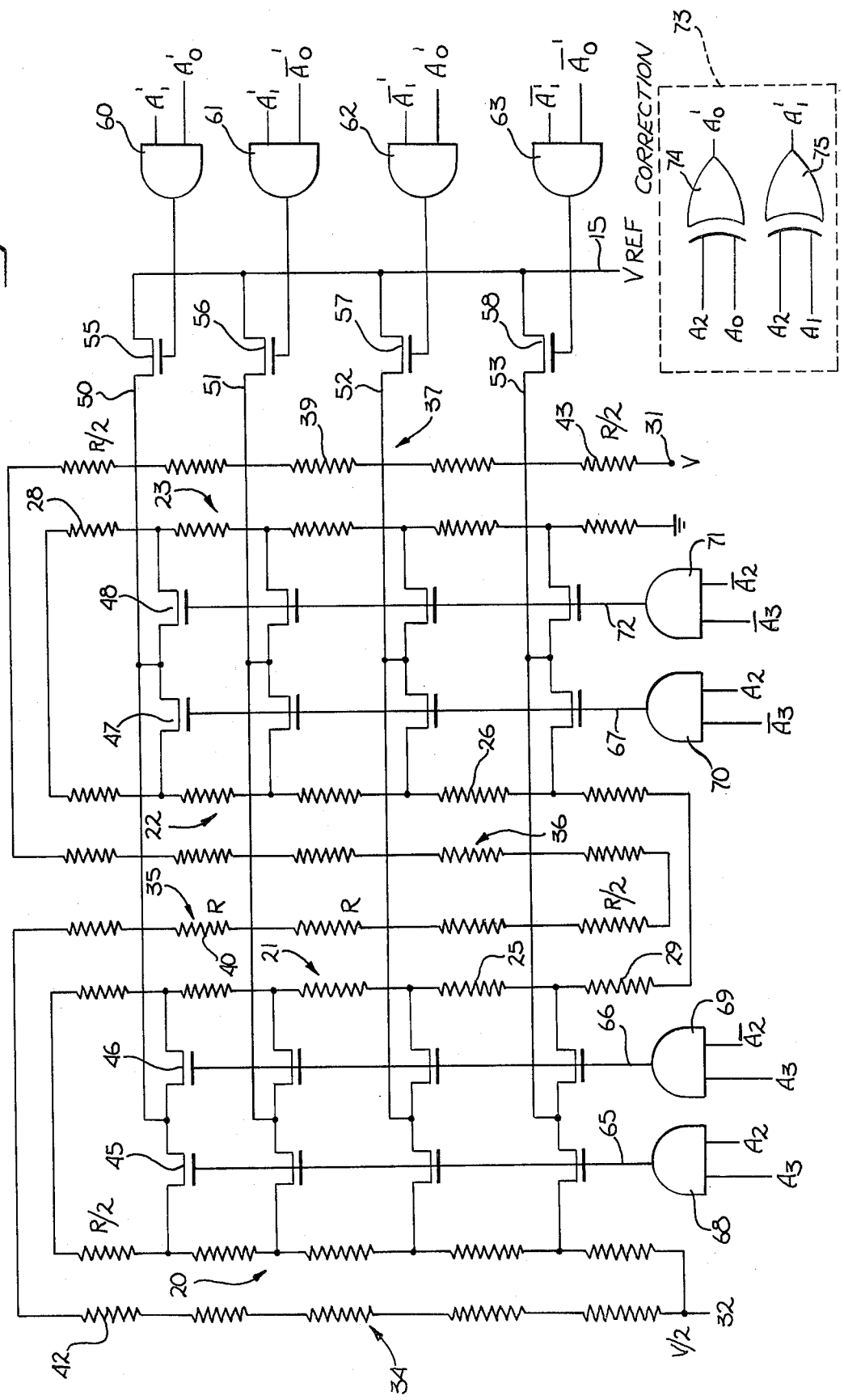
FIG. 3 is an electrical schematic of the presently preferred embodiment of the digital-to-analog converter employed with the invented analog-to-digital converter.

An integrated circuit, metal-oxide-semiconductor (MOS), analog-to-digital converter (ADC) is described. The converter may be operated from a single power supply potential and is able to convert an analog signal equal to the power supply potential. This is accomplished by the described ADC with practically no bootstrapping circuits.

In the following detailed description, numerous specific details such as channel sizes, switching time, etc. are provided in order that the present invention may be fully understood. However, it will be obvious to one skilled in the art that the invention may be employed without using these specific details. In other cases, well-known circuits have been shown in block diagram form in order not to obscure the present invention in unnecessary detail.

In the presently preferred embodiment, the described ADC is fabricated on a p-type silicon substrate employing known MOS silicon gate technology. This substrate includes a microcomputer. This microcomputer is of the general type described in copending application Ser. No. 636,535, filed Dec. 1, 1975 and assigned to the assignee of this application, now U.S. Pat. No. 4,153,933. The ADC and this microcomputer operate from a single power supply of +5 volts. The substrate includes a back biasing generator for providing substrate biasing.

Referring first to FIG. 1, the block diagram of the ADC is applicable both to prior art converters and to the converter of the present invention. The ADC includes a sample and hold means 12 which receives an input analog signal on line 10. The ADC includes a digital-to-analog converter (DAC) 14 which is used in a somewhat ordinary manner to generate a reference potential on line 15. The output of the sample and hold means 12 is compared with the output of the DAC 15 and the results of the comparison, typically a binary 1 or 0 is coupled to the logic means 18. Logic means 18 controls the DAC 15 via lines 19. Generally, a successive approximation algorithm is implemented by the logic means 18. For example, once the sample and hold means 12 samples the input analog signal, it is compared with a reference signal from the DAC which corresponds to ½ a full scale signal. (In the presently preferred embodiment $V_{IN}/2$ is employed). If the results of this comparison indicate that the input analog signal is larger than this reference signal, then logic means 18 causes the next signal on line 15 to be an analog signal equivalent to ¾ of a full scale reference signal. On the other hand, if the comparison indicates that the input analog signal is less than the first reference signal, then the logic means 18 changes the output of the DAC 14 to a ¼ scale signal. These successive approximations continue until logic means 18 determines the digital equivalent to the input analog signal.

In the presently preferred embodiment, the sample and hold means function is performed by a portion of the circuit shown in FIG. 2. The circuit of FIG. 2 also includes the presently preferred embodiment of the comparator. The sample and hold means of FIG. 2 capacitively divides the input analog signal by two. The DAC for the presently preferred embodiment is shown in FIG. 3. (Only a 4 bit converter is shown in FIG. 3, while an 8 bit converter is actually employed). This DAC as will be described in greater detail, includes resistors for dividing the power supply potential or other input reference potential by two.

First referring to FIG. 3, the DAC includes a resistance ladder which is formed from a plurality of resistor strings. Parallel resistor strings 20, 21, 22 and 23 each include a plurality of resistors, such as resistors 25 and 26, all having a resistance "R". The ends of each of these resistor strings include resistors, such as resistors 28 and 29, having a resistance of "R"/2. The resistance ladder of this DAC is folded, that is, the upper end of resistor string 20 is coupled to the upper end of resistor string 21, the lower end of resistor string 21 is coupled to the lower end of resistor string 22, and the upper end of resistor string 22 is coupled to the upper of resistor string 23. The other end of resistor string 23 is coupled to ground. One end of resistor string 20, node 32, receives the potential V/2 as will be described.

A pair of field-effect transistors are coupled between the resistors of adjacent resistor strings in the resistance ladder. For example, transistors 45, 46 are coupled between resistors of strings 20 and 21. In a similar manner, transistors 47 and 48 are coupled between resistors in the strings 22 and 23. Pairs of transistors corresponding to transistor pairs 45 and 46, and 47 and 48 are coupled between each of the resistors of the parallel resistor strings 20 and 21, and 22 and 23. The common junction between each of these transistor pairs is coupled to a row line. For example, the common junctions between transistors 45 and 46, and transistors 47 and 48 are coupled to a row line 50. Similarly, the other transistor pairs are coupled to row lines 51, 52 and 53. The gates of each of these transistors are coupled to a column line. For example, the gate of transistor 45 and the gates of the other transistors in this column are coupled to line 65. Similarly, the other transistors are coupled to column lines 66, 67 and 72.

Each of the row lines are coupled to an output line 15 through a row select transistor. Specifically, line 50 is coupled to line 15 through transistor 55, line 51 through transistor 56, line 52 through transistor 57, and line 53 through transistor 58.

A "dummy" resistance ladder which consists of a second plurality of resistor strings is interlaced with the resistance ladder of the DAC. Specifically, resistor strings 34, 35, 36 and 37 are interlaced with strings 20, 21, 22 and 23. The resistor strings of the dummy resistance ladder are generally parallel to the first resistor strings and include a plurality of resistors such as resistors 39 and 40, each having a resistance "R". The ends of each of the strings include resistors having a resistance of "R"/2, such as resistors 42 and 43. The resistor strings 34, 35, 36 and 37 are coupled to one another in the same manner as the resistance ladder of the DAC. One end of resistor string 37 (line 31) is coupled to the potential V. One end of resistor string 34 is coupled to node 32 and provides the potential of V/2 for the resistance ladder of the DAC.

The dummy resistance ladder is employed to reduce the potential V by a factor of 2. By interlacing the resistor strings, the resistance of strings 20, 21, 22 and 23 remain substantially equal to the resistance of strings 34, 35, 36 and 37. This occurs since process variations effect adjacent strings in the same manner. For this reason, when the potential V is applied to line 31, the potential at node 32 is equal to V/2.

For a more complete discussion of the DAC of FIG. 3 (without the dummy resistance ladder), see copending application Ser. No. 717,442, filed Aug. 24, 1976, now U.S. Pat. No. 4,146,882. This copending application describes the manner in which the resistance ladders are fabricated, and the fact that the described layout minimizes inaccuracies from masking misalignments. In the presently preferred embodiment, all the resistor strings are formed as shallow arsenic regions in a silicon substrate.

For the 4-bit DAC of FIG. 3, a single column line and a single row line is selected for each of the possible combinations of the signals $A_0$, $A_1$, $A_2$, and $A_3$. These signals are coupled to the DAC by lines 19 (FIG. 1). The column line 65, 66, 67 and 72 are coupled to the AND gates 68, 69, 70 and 71, respectively. The row lines 50, 51, 52 and 53 are selected by the AND gates 60, 61, 62 and 63, respectively. Since the strings of the ladder are folded, a correction circuit 73 is employed to compensate for this folding. This circuit consists of exclusive OR gates 74 and 75. The XOR gate 74 receives the $A_0$ and $A_2$ signals and provides the $A_0'$ signal. The XOR gate 75 receives the $A_1$ and $A_2$ signals and provides the corrected signal $A_1'$. The $A_0'$ and the $A_1'$ signals and their complements are coupled to the input terminals of the gates 60, 61, 62 and 63 as shown in FIG. 3.

As mentioned for each possible combination of the $A_0$, $A_1$, $A_2$ and $A_3$ signals, the appropriate analog potential is provided on line 15. For example, assume that all of these signals are binary ones. Examining the column lines, column 65 would be selected since the condition for AND gate 68 are satisfied when $A_2$ and $A_3$ are binary ones. The $A_1'$ signal and $A_0'$ signal will both be in their low state since the inputs to the exclusive OR gates 74 and 75 are all binary ones. For these conditions, the output of AND gate 63 is high causing line 53 to be coupled to line 15. Thus, when $A_0$, $A_1$, $A_2$ and $A_3$ are all binary ones, the highest potential in the DAC is selected. If $A_0$, $A_1$, $A_2$, $A_3$ are all binary zeros, then line 72 is selected along with row line 53 coupling the lowest potential of the resistance ladder to line 15. Similarly, all the intermediate binary numbers select the appropriate tap of the resistance ladder.

Referring now to FIG. 2, this circuit receives a reference signal from the DAC on line 15 and an input analog signal on line 10. Line 15 is coupled to capacitors 89 and 90 through transistors 86 and 87, respectively. The gates of transistors 86 and 87 receive a control signal on line 83 from the timing means 80. Capacitors 89 and 90 are coupled to node 92. Node 92 is selectively coupled to ground through transistor 95; node 91 is selectively coupled to $V_{IN}$ (line 10) through transistors 94. The gates of transistors 94 and 95 are selected by a signal on line 84 by the timing means 80. The capacitors 89 and 90 have equal capacitance; these matched capacitors are formed in the presently preferred embodiment, from a polysilicon layer and an aluminum layer separated by oxide. As will be described in greater detail, these capacitors along with transistors 86, 87, 94 and 95 are employed to provide the signal $V_{REF}$-$V_{IN}/2$ at node 92.

The first stage of the comparator of FIG. 2 includes the series transistors 97 and 98 coupled in series between the potential V and ground. The gate of transistor 97 is coupled to the potential V. Node 92 is coupled to the gate of transistor 98. The common node between transistors 97 and 98 is coupled to node 92 through transistor 99. The gate of transistor 99 is coupled to the ramp generator 81. Transistors 101 and 102 are coupled in series between line 31 (V potential) and ground. This second stage of the comparator receives an input signal on the gate of transistor 102. The output from this stage is capacitively coupled through capacitor 104 to the gate of transistor 107. Transistors 106 and 107 (third stage of the comparator) are coupled in series between line 31 and ground. The common junction between these transistors is coupled to the gate of transistor 110 and to the gate of transistor 107 through transistor 117. The gate of transistor 117 is coupled to the ramp generator 81. The fourth stage of the comparator comprising transistors 109 and 110 are also coupled in series between line 31 and ground. The common junction between these transistors is used to drive a push-pull output stage.

The output stage comprises the depletion mode transistor 112 coupled in series with transistors 113 between line 31 and ground; and the transistors 115 and 116, also coupled between line 31 and ground. The input to this final stage is coupled to the gates of transistors 113 and 115. The source region and gate of transistor 112 are coupled to the gate of transistor 116. The output signal from the comparator which is either a binary one or zero is provided on line 17.

The timing means 80 as will be described provides signals on lines 83 and 84 for coupling the $V_{IN}$ signal to node 91 and then for coupling the $V_{REF}$ signal to capacitors 89 and 90. In the presently preferred embodiment, the signal on line 84 is bootstrapped to permit a signal on line 10 equal to the power supply potential (V) to be coupled through transistor 94. The timing means 80 may be an ordinary, well-known circuit means.

The ramp generator 81 generates two separate ramp signals 123 and 124. The ramp signal 123 is coupled to the gate of transistor 99 while the ramp signal 124 is coupled to the gate of transistor 117. As is shown on the time axis 121, these ramp signals are separated one from the other, in time, for reasons which will be explained later in this application.

As mentioned and as is apparent from FIG. 3, the power supply potential is divided by two by the dummy resistance ladder of FIG. 3. The input analog signal ($V_{IN}$) is likewise divided by two by capacitors 89 and 90. In operation, timing means 80 first causes transistors 94 and 95 to conduct. Node 91 is charged to the $V_{IN}$ potential while node 93 is coupled to ground. Note that because of the bootstrapping of the signal on line 84, node 91 may be charged to the $V_{IN}$ potential on line 31 even if this potential is equal to V. After this, the potential on line 84 decreases to cutoff transistors 94 and 95 and a potential is applied to line 83 to cause transistors 86 and 87 to conduct. This couples the $V_{REF}$ signal on line 15 to capacitors 89 and 90. The resultant voltage change on node 92 is equal to $V_{REF}$-$V_{IN}/2$ if the capacitance of capacitors 89 and 90 is equal.

As mentioned, capacitors 89 and 90 are fabricated from layers of polysilicon and aluminum which are separated by an oxide layer. Since it is generally difficult to provide a uniformly thick oxide layer, a common centroid geometry is employed for these capacitors so that the oxide thickness variations become less significant as shown in FIG. 4. The capacitor 89 includes the opposite polysilicon members 89a and 89b which are interconnected by the metal line 127. The capacitor 90 includes the polysilicon members 90a and 90b which are interconnected by the polysilicon line 128. The upper electrode of capacitors 89 and 90 is plate 125 which is connected to node 92. The cross shaped opening 126 in plate 125 allows line 127 and its contacts to members 89a and 89b to be formed without interference with plate 125. Note that with the cross shaped opening 125, slight misalignments of the opening with respect to members 89a, 89b, 90a and 90b do not change the total area between these members and the plate 125. Also, "dummy" contacts 129 and 130 provide compensation for the contacts leading to nodes 91 and 93.

For a discussion of a capacitive, successive approximation ADC using binary weighted capacitors, see *IEEE Journal Solid State Circuits*, Dec. 1975 "All-MOS Charge Redistribution Analog-To-Digital conversion Techniques-Part I" by McCreary & Gray, pp 371-379.

It should be noted that capacitors 89 and 90 retain their charge sufficiently long to allow the successive approximations to be completed through the logic means 18 of FIG. 1. That is, once $V_{IN}$ has been sampled, the $V_{REF}$ voltage on line 15 may be changed a number of times without again sampling $V_{IN}$.

During the period of time that the $V_{IN}$ potential is coupled to node 91, transistors 99 and 117 conduct to establish a bias point for the first four stages of the comparator. After this bias point has been established and the $V_{REF}$ signal coupled to capacitors 89 and 90, the comparator senses the relative polarity of the $V_{REF}$ signal when compared to $V_{IN}/2$. If the $V_{REF}$ signal is more positive than $V_{IN}/2$, a binary one is provided on line 17. On the other hand, if the $V_{REF}$ signal is more negative than $V_{IN}/2$ a binary zero is provided on line 17. Thus, the comparator may be thought of as a one bit analog-to-digital converter.

The first four stages of the comparator are identical. The load transistors such as transistors 97, 101, 106 and 109 have a Z/L ratio of 10/20. The input transistor for each of these four stages, specifically transistors 98, 102, 107 and 110 have a Z/L ratio of 100/10. The Z/L ratio for transistors 99 and 117 is 10/6. As is apparent, two of the stages of the comparator are direct coupled while the other two stages are AC coupled.

The enhancement mode transistors of the first four stages are initially self-biased since transistors 99 and 117 conduct when $V_{IN}$ is sampled. The operating point for these stages is in a linear region. Thus, these four stages operate as an AC amplifier and amplify the differential signal which is coupled to node 92. The push-pull stage comprising transistors 112, 113, 115 and 116 operate in an ordinary manner to amplify the output from the fourth stage of the comparator and to provide an output signal on line 17. $V_{REF}$-$V_{IN}/2$ causes a drop in potential on node 92, less conduction occurs in transistor 98 causing more conduction in transistor 102. This lowers the potential applied to the gate of transistor 107, lowering the voltage applied to the gate of transistors 113 and 115. Line 17 is thus pulled towards ground to provide a low output. On the other hand, if $V_{REF}-V_{IN/2}$ causes a rise in potential on line 92, line 17 is driven to a high state.

On inherent problem with the comparator amplifier of FIG. 2 and other chopper amplifiers is the input voltage offset characteristics caused by the analog switches and by the parasitic coupling of the switching signals into the input signal. Two techniques are employed in the comparator of FIG. 2 to substantially reduce this offset.

First, the offset is substantially reduced by sequentially deactivating the transistors 99 and 117. First, transistor 99 ceases to conduct followed by transistor 117 as indicated by curves 123 and 124 shown within the ramp generator 81. The coupling offset caused by the analog switches of FIG. 2 is absorbed by the succeeding capacitor and nullified. In this manner, even though gain is obtained from each stage, the input offset error is amplified by the gain of a pair of stages rather than being amplified by the gain of all the stages. For a more thorough discussion of this "residual voltage successive memorization" see "Low-Level MOS Transistor Amplifier Using Storage Techniques", *IEEE International Solid-State Circuits Conference Digest Technical Papers*, Feb. 1973, pp. 152–153.

The second technique used to reduce the offset voltage is to employ ramps to turn off transistors 99 and 117 as indicated by the ramps 123 and 124 in FIG. 2. These ramps have a decay time of approximately one microsecond in the presently preferred embodiment. When these switches are turned off, an offset voltage is developed between the input and output of the stages. However, by turning these switches off slowly, the switching device has sufficient time to conduct current to equalize the voltage across it. In practice less than a two millivolt offset results.

The DAC of FIG. 3 along with the comparator of FIG. 2 are employed as mentioned in the ADC of FIG. 1. It should be noted that with the resistance ladder employed in the DAC of FIG. 3, the analog output of this ladder is inherently monotonic. This ensures that there will be no missing codes in the ADC. In many applications, this property is more important than absolute accuracy.

Thus, an ADC has been disclosed which may be fabricated as an MOS integrated circuit and which may be included on a substrate with other circuits including a microcomputer.

We claim:
1. An MOS analog-to-digital converter comprisng:
input means coupled for receiving an input signal and for capacitively dividing it by two;
a digital-to-analog converter, said converter including a first resistance ladder comprising a plurality of parallel first resistor strings each having a plurality of resistors separated by taps and switching means for selecting said taps to provide output reference signals, and a second resistance ladder comprising a plurality of second resistor strings interlaced with said first resistor strings, said first ladder coupled to said second ladder;
comparator means coupled to receive said capacitively divided signal from said input means and said reference signals for comparing said signals;
logic means for controlling said digital-to-analog converter so as to select one of said reference signals most comparable to said analog signal, said logic means coupled to said digital-to-analog converter and to said comparator means;
whereby said second ladder provides a consistent reduction of a potential applied to said digital-to-analog converter and permits switching of said reference signals without bootstrapping.

2. An MOS analog-to-digital converter adaptable for operating from a single power supply potential comprising:
input means for receiving an input analog signal and for capacitively dividing said signal by two;
a digital-to-analog converter, said converter including means for receiving said power supply potential and for reducing said potential by two, including a first resistance ladder comprising a plurality of parallel resistor strings each string having a plurality of resistors separated by taps and a plurality of switching means coupled to said ladder for selecting said taps to provide reference signals, and a second resistance ladder comrising a plurality of parallel resistor strings interlaced with said resistor strings of said first ladder so as to minimize the effects of process variations between said first and second ladder, said second ladder for providing said reduction of said potential;
comparator means for providing an output signal representative of the comparison of said reference signals and said divided input signal, the inut of said comparator means coupled to said digital-to-analog converter and to said input means;
logic means for controlling said digital-to-analog conveerter in response to said output signal from said comparator means, the input to said logic means coupled to said comparator means and the output of said logic means coupled to said digital-to-analog converter;
whereby said analog-to-digital converter is capable of converting to a digital signal, an analog signal which equals in magnitude said power supply potential with a minimum amount of bootstrapping.

* * * * *